United States Patent [19]

DeVolk

[11] Patent Number: 5,389,408
[45] Date of Patent: Feb. 14, 1995

[54] METHOD FOR CURING METAL PARTICLES INTO CONTINUOUS CONDUCTORS

[75] Inventor: Burt DeVolk, Albuquerque, N. Mex.

[73] Assignee: Printron, Inc., Albuquerque, N. Mex.

[21] Appl. No.: 171,986

[22] Filed: Dec. 23, 1993

Related U.S. Application Data

[63] Continuation of Ser. No. 853,237, Mar. 18, 1992, abandoned.

[51] Int. Cl.$^6$ .................................. B05D 5/12
[52] U.S. Cl. ........................ 427/559; 427/96; 427/191; 427/192; 427/197; 427/201; 427/256; 427/591; 427/598
[58] Field of Search ............... 427/591, 598, 191, 192, 427/256, 559, 197, 201, 96

[56] References Cited

U.S. PATENT DOCUMENTS

| 4,278,702 | 7/1981 | Jeng ..................... 427/45.1 |
| 5,014,420 | 5/1991 | Howard et al. ............ 29/846 |

*Primary Examiner*—Bernard Pianalto
*Attorney, Agent, or Firm*—Lowe, Price, LeBlanc & Becker

[57] ABSTRACT

A method and apparatus is disclosed for curing metal particles into continuous metal conductors on a nonconducting substrate. The apparatus includes a generator for supplying radio frequency energy through an impedance matching circuit to a coil positioned proximate to the substrate. The coil and substrate are placed in a chamber which is evacuated prior to curing and then pressurized with nitrogen gas. The electromagnetic flux lines generate eddy currents in the particles which heat them until at least some melt, thereby converting the metal particles into continuous conductors.

30 Claims, 6 Drawing Sheets

METHOD FOR CURING METAL PARTICLES INTO CONTINUOUS CONDUCTORS

This application is a continuation of application Ser. No. 07/853,237, filed Mar. 18, 1992, now abandoned.

TECHNICAL FIELD

This invention relates generally to an apparatus and method for curing metal particles into continuous conductors and more particularly to an apparatus and method for making printed circuit boards by curing metal particles arranged in a printed circuit pattern on a dielectric substrate into continuous metal conductors.

BACKGROUND ART

Prior art systems for manufacturing printed circuit boards employ either a "subtractive" or an "additive" process. The starting material in the subtractive process is an insulating substrate which has a relatively thick layer of copper laminated to one or both of its sides. An etch-resistant material or "resist," typically in ink form, is applied by silk-screening or a similar technique over each copper layer in a positive image of the desired circuit configuration to be fabricated thereon.

Alternatively, to yield greater circuit density through increased resolution (i.e., narrower trace width) and uniform reduced spacing between adjacent traces, photographic techniques are used in which a photo-sensitive resist (so-called "photo-resist") is uniformly disposed over each copper layer. An appropriate photographic transparency is then made in the form of a negative of the desired circuit configuration for each side of the board. Each side is exposed through its corresponding transparency to intense ultra-violet light. Those regions of the photo-resist which were exposed to this light polymerize and become etch-resistant, so that a positive latent image of the desired circuitry is formed in the photo-resist after exposure.

Once the desired circuit pattern is formed in the resist, regardless of the specific technique used, the board is immersed in a copper etchant bath which removes all the copper not protected by the resist or polymerized photo-resist. When the etching is complete, the board is removed from the bath and the remaining resist is removed, leaving the laminated copper on each side in the form of the desired circuit configuration.

There are a number of disadvantages with the subtractive printing processes. First, the boards produced by this process have significant material costs because they use expensive photochemicals, resists and etchants and waste substantial amounts of copper. Second, the trace width is limited by "undercutting," i.e., lateral undermining of the traces under the resist. Third, this process is highly polluting because the unwanted copper must be chemically etched from the substrate. Fourth, this process is time consuming, typically requiring 90 minutes or more to manufacture a printed circuit board. Fifth, capital equipment and labor costs associated with subtractive processes are substantial.

There are two general types of additive processes, "thin film" and "thick film," both of which start with an unclad insulating substrate. In the thin film process an activating agent, which promotes adhesion of copper to the substrate, is applied over the entire surface thereof. A mask is then applied to the substrate and the substrate is immersed in an electroless copper plating bath which deposits copper onto all the non-masked areas including the walls of the pre-drilled holes. Once plating is completed, the board is removed from the bath and a protective coating (e.g., a solder mask) is applied over each plated side of the board.

There are also a number of disadvantages with prior art thin film additive processes. First, substantial time is required to electrolessly deposit a copper coating of sufficient thickness on the substrate to form conductors. Second, once this coating is deposited it adheres extremely poorly to the substrate, i.e., the plated copper traces easily peel off the substrate during subsequent manufacture or use of the board. Third, electrolessly deposited copper has inferior physical properties compared with electrolytically deposited copper. For example, the conductivity of electrolessly deposited conductors is substantially less than the conductivity of electrolytically deposited conductors.

In the thick film process conductive particles are suspended in a binder or "carrier," forming a viscous "ink." The ink is then screened onto the substrate in the desired pattern and dried, causing the carrier to vaporize. The remaining metal particles are then "fired" or sintered at high temperature into conductors.

One such thick film process is disclosed in U.S. Pat. No. 4,278,702. In this process a paste comprising metallic particles suspended in a viscous carrier is applied to a substrate using a conventional silk screen process in which openings have been formed in the screen in the desired circuit pattern. Thereafter, a high frequency electromagnetic field is applied to the substrate which heats the metal particles to a sufficient temperature to sinter them. This process has a number of disadvantages. First, since the sintered particles are joined only in the proximity of their surfaces, the conductors are not mechanically strong and may be ruptured easily when subjected to modest mechanical stress. Second, the sintered conductors have lower conductivity than solid metal conductors. Third, sintered conductors are more subject to chemical corrosion than solid conductors.

Another prior art additive process is disclosed in U.S. Pat. No. 5,014,420. In this process metal particles of substantially uniform surface area are applied to a substrate either as a powder or ink using electrostatic forces. The particles are then fused into solid conductors using a highly concentrated, high frequency electromagnetic field which sequentially scans across the surface of the substrate. This process also suffers from a number of deficiencies. First, since the force on the particles varies as the square of the flux density and this force tends to drive the particles out of the concentrated electromagnetic field, it is difficult to control the location of the resulting conductors on the substrate. Second, since the electromagnetic field is scanned across the substrate, excessive time is needed to cure the conductors. Third, since particles of substantially uniform size are used, there is considerable shrinkage in the deposited traces when the particles are melted, which could lead to unwanted pattern distortion or breaking up of the conductive traces.

Accordingly, one object of the present invention is to provide a new and improved apparatus for and method of manufacturing printed circuit boards.

Another object of the invention is to provide a new and improved system for additive printing of printed circuit boards.

Still another object of the present invention is to provide a new and improved apparatus for and method of rapidly making printed circuit boards.

Yet another object of the present invention is to provide a new and improved apparatus for and method of making printed circuit boards with minimal polluting byproducts.

Still another object of the present invention is to provide an apparatus and method for curing metallic particles deposited on a dielectric substrate into solid electrical conductors thereon.

Still another object of the present invention is to provide an apparatus and method for making printed circuit boards inexpensively.

Additional objects, advantages and novel features of the invention will be set forth in part in the description which follows, and in part will become apparent to those skilled in the art upon examination of the following or may be learned by practice of the invention. The objects and advantages of the invention may be realized and obtained by means of the instrumentalities and combinations particularly pointed out in the appended claims.

DISCLOSURE OF THE INVENTION

According to the present invention, the foregoing and other objects are attained by providing an apparatus for curing metal particles deposited in a predetermined pattern on a nonmetallic substrate into continuous metal conductors arranged in this pattern. The apparatus supplies sufficient electromagnetic energy simultaneously to the particles on the substrate to melt at least some of them.

In accordance with another aspect of the invention, the foregoing and other objects are attained by providing an apparatus for making printed circuits on a dielectric substrate on which metal particles having a large size distribution are deposited in a predetermined pattern. The apparatus comprises a device for applying simultaneously to the particles an amount of electromagnetic energy sufficient to melt at least some of them.

In accordance with another aspect of the invention, the foregoing and other objects are attained by providing a method of curing metal particles deposited in a predetermined pattern on a non-metallic substrate into continuous metal traces arranged in this pattern. This method comprises applying sufficient electromagnetic energy simultaneously to the particles to melt at least some of them.

In accordance with yet another aspect of the invention, the foregoing objects are attained by providing a method of making printed circuit boards on a dielectric substrate on which metal particles having a large size distribution are deposited in a predetermined pattern. The method comprises applying simultaneously to all of these particles a sufficient amount of electromagnetic energy to melt at least some of them.

In accordance with another aspect of the invention, the foregoing objects are attained by providing a method of and apparatus for sequentially curing metal particles into continuous conductors on a plurality of dielectric substrates.

BRIEF DESCRIPTION OF THE DRAWINGS

FIG. 8 ($b$) is a graph of a bi-modal gaussian/exponential size distribution for metal particles used in the present invention.

DESCRIPTION OF THE PREFERRED EMBODIMENT

Figure 1:
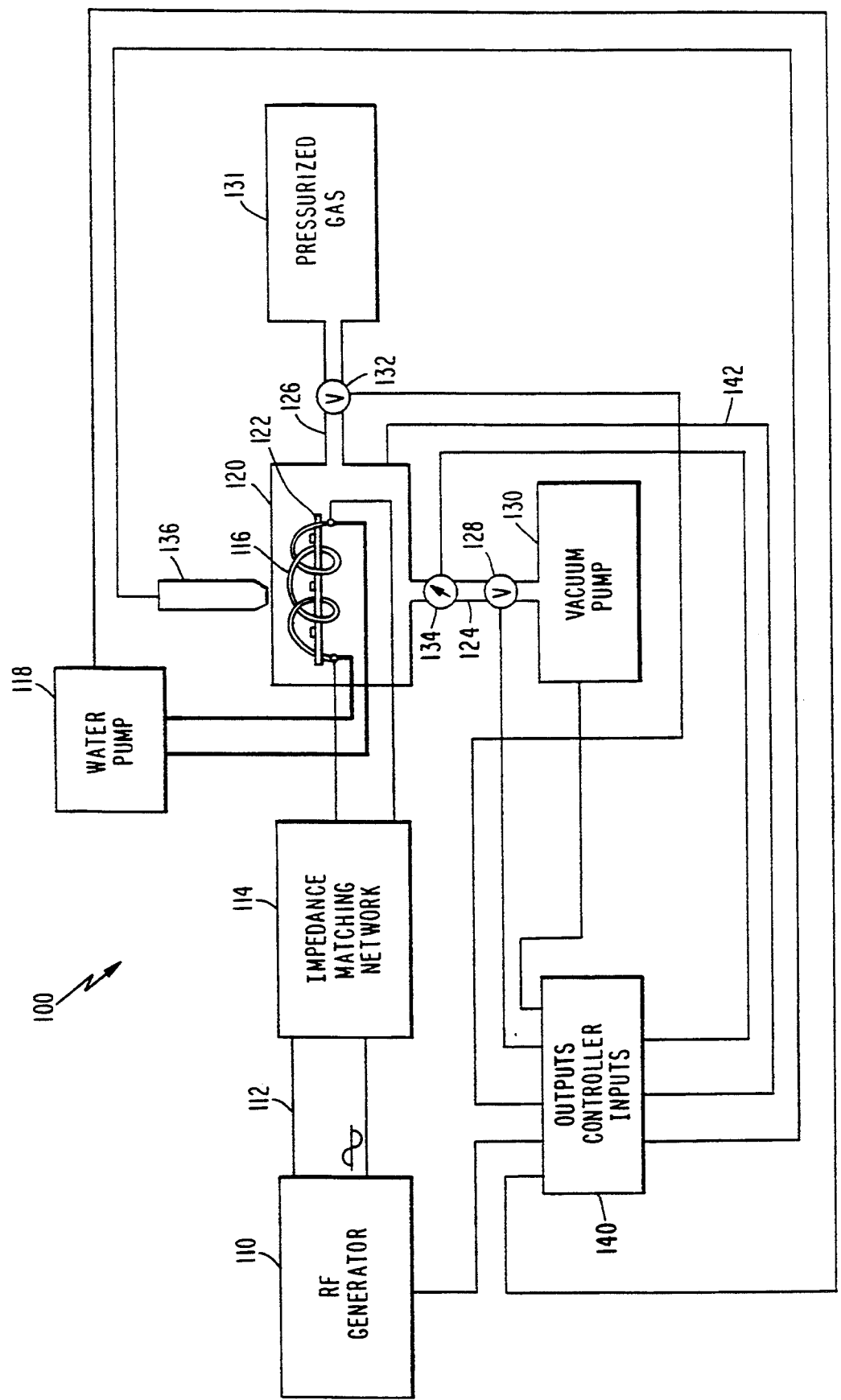
FIG. 1 is a block diagram and partial schematic of the printed circuit board curing apparatus of the present invention.

Referring to FIG. 1, the curing system 100 of the present invention is shown in block diagram and partial schematic form. A conventional radio frequency generator 110 generates a high energy radio frequency signal which is transmitted over a standard 50 ohm cable 112. In the preferred embodiment generator 110 outputs a 13.56 MHz signal at a power of between 0.5 to 3.0 kw. It should be understood, however, that the frequency and power applied by generator 110 may vary according to the desired curing speed and the particle size distribution. This signal is fed to a conventional impedance matching network 114. Network 114 matches the impedance of a curing coil 116, described in greater detail below, to the 50 ohm load on cable 112. Typically, coil 116 has a resistance of between 0.05 to 0.1 ohms.

Due to impedance matching substantially all of the power generated by RF generator 110 is absorbed in the coil resistance so that large currents flow through coil 116 and it generates a correspondingly large amount and intensity of electromagnetic flux lines which are relatively uniform over the cross-sectional area of the coil. Coil 116 is positioned in a curing chamber 120, described in more detail hereinafter. A substrate 122 containing the pattern of metallic particles to be cured into printed circuit conductors is placed adjacent coil 116, as shown more clearly in FIG. 5. Several different coil configurations may be used in the instant invention, as described hereinafter.

Two pneumatic pipes 124 and 126 are connected to curing chamber 120 through standard fittings, not shown. Pipe 124 is connected through a conventional pneumatic valve 128 to a vacuum pump 130 which evacuates curing chamber 120 prior to activation of curing coil 116. In the example described below, vacuum pump 130 evacuates 20 cubic feet per minute, so that curing chamber 120 is evacuated to 5 microns Hg in 20–30 seconds using a 3 inch diameter evacuation pipe. It should be understood, however, that the evacuation time may be reduced by using a larger pump and/or larger diameter evacuation pipe.

Pipe 126 is connected through a second conventional pneumatic valve 132 to a source of pressurized gas 131. In the example below standard welding grade nitrogen gas is used which pressurizes curing chamber 120 after it has been evacuated by pump 130. Alternatively, argon, helium or another inert gas may be used. Nitrogen is preferred, however, because it has a higher break down voltage than the inert gasses and does not react with copper or copper alloys in traces 138 during the short period of time in which coil 116 is energized. A conventional pneumatic pressure gauge 134 measures the pressure in chamber 120.

Figure 5:
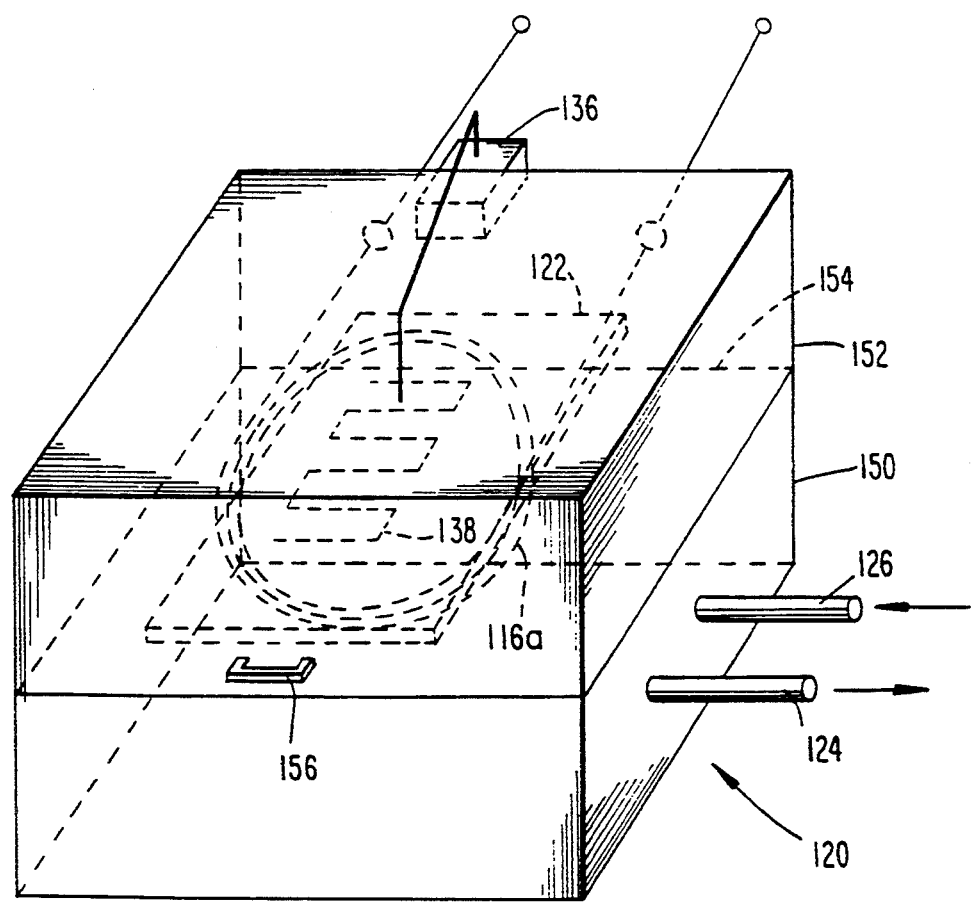
FIG. 5 is a perspective view of the curing unit in accordance with the present invention.

In the preferred embodiment the top surface of curing chamber 120 is made of an optically transparent material, such as acrylic. A conventional infrared temperature measuring probe 136, such as a pyrometer, is mounted to the top of curing chamber 120, as shown in FIG. 5. It is positioned to detect the wavelength distribution of light emitted by metallic traces 138 on substrate 122 as they heat up after energization of coil 116. Alternatively, rather than sensing the temperature of the entire deposited pattern, optical sensor 136 can be focused on one or more test spots deposited on the substrate 122 in areas which do not interfere with traces 138.

In the preferred embodiment coil 116 is made of hollow copper and water cooled to reduce the heat generated by the substantial current flow therethrough. As shown in FIG. 1, the cooling water is supplied by a conventional water pump 118.

The outputs of optical sensor 136 and pressure sensor 134 are fed to controller 140, whose operation is described in more detail below. Using these inputs controller 140 generates outputs which control radio frequency generator 110, valves 128 and 132, vacuum pump 130 and water pump 118, again in the manner described below.

As shown in FIG. 5, curing chamber 120 comprises a base 150 and a cover 152. Cover 152 is hinged along edge 154 to base 150. Cover 154 may be opened by means of handle 156. An electrical interlock, not shown, is connected to the input of controller 140 over line 142. Thus, cover 154 must be closed for controller 140 to generate the outputs described below. Suitable sealing means, not shown, are provided around the upper perimeter of base 150 and the lower perimeter of cover 152 to render curing chamber 120 suitable for evacuation of gasses by pump 130 and pressurization by gas source 131 during the curing operation.

Figure 2:
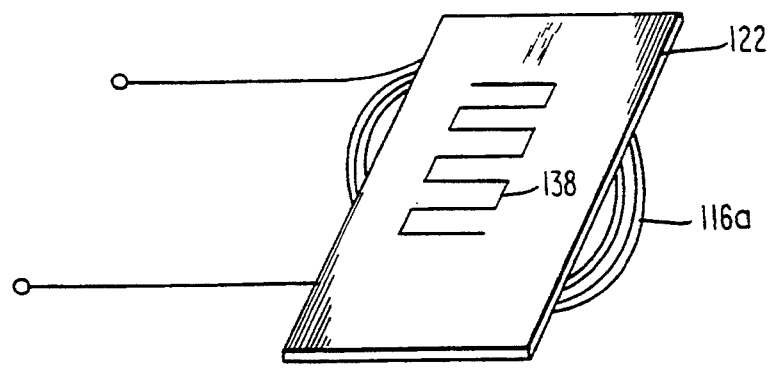
FIG. 2 is a perspective view of one embodiment of a coil used in the instant invention for imparting electromagnetic energy to the metal particles deposited on a substrate.
Figure 3:
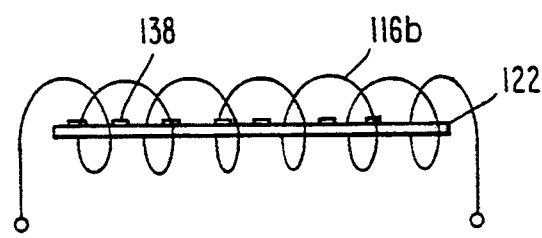
FIG. 3 is an alternative embodiment of a coil used in the instant invention for imparting electromagnetic energy to the metal particles deposited on a substrate.
Figure 4:
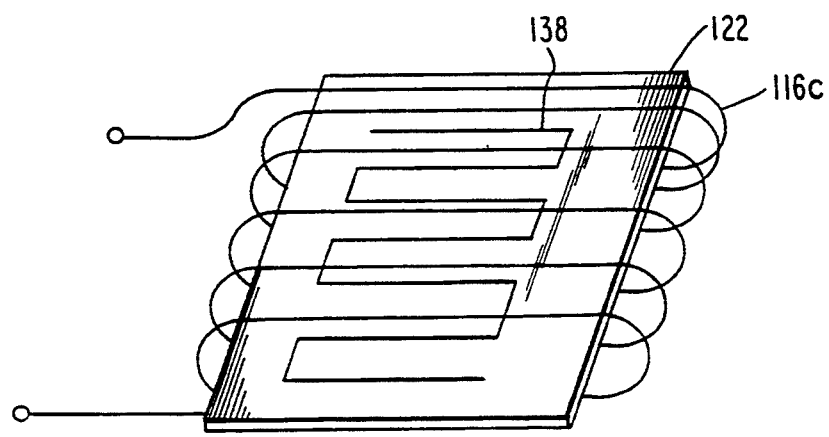
FIG. 4 is a third alternative embodiment of a coil used for imparting electromagnetic energy to the metal particles deposited on a substrate.

A variety of different coil configurations are suitable for use with the instant invention, as illustrated in FIGS. 2–4. FIG. 2 illustrates a toroidal coil 116a in which the turns are wound around the perimeter of a circle. For best results the inner diameter of coil 116a is greater than the maximum perimeter dimensions of traces 138 so that all of the traces may be positioned in the area defined by the central opening of coil 116a. In the preferred embodiment coil 116a comprises 6–8 turns of 1/16 inch inner diameter hollow copper tubing, although it should be understood that more or less turns may be used and the coil may have a larger or smaller inside diameter. In operation toroidal coil 116a may be placed underneath or above substrate 122.

FIG. 3 illustrates a solenoidal curing coil 116b which may be used with the present invention. As shown therein, the coil is wound as a helix which defines a cylindrical central opening on the interior thereof. Substrate 122, the edge of which is shown in FIG. 3, is inserted into the central opening. In the preferred embodiment the solenoidal coil has 10–15 turns, although it should be understood that more or less turns may be used. The solenoidal coil also is made from hollow copper tubing and, in the preferred embodiment, has an inside diameter of ⅛ inch, although again it should be understood that other sizes may be used in practicing the instant invention.

FIG. 4 illustrates an alternative solenoidal coil 116c in which the turns have been flattened and lengthened so that the cross-section of the interior portion more closely resembles an ellipse. In this embodiment substrate 122 also is placed into the interior portion of the coil. The preferred embodiment of this coil has 10–15 turns and an inside diameter of ⅛ inch, although again it should be understood that other sizes also may be used.

Each of the foregoing coil configurations has advantages and disadvantages which renders its use dependent upon the particular application. Toroidal coil 116a has the advantage that it may be used with larger substrates, since the substrate is positioned above the coil. With this coil, however, the lines of electromagnetic flux are perpendicular to the substrate, so that each line only penetrates particles aligned along this perpendicular axis, thus rendering this coil somewhat less efficient than solenoidal coils. In contrast, the flux lines in solenoidal coils 116b and 116c run along the longitudinal axis of the coil, parallel to the upper surface of the substrate. Thus, each flux line passes through a larger number of particles, thereby increasing the efficiency of this design. On the other hand, since substrate 122 must be positioned inside the solenoidal coils, they typically would be used with smaller substrates. Solenoidal coil 116c overcomes this size limitation to a certain extent, however, because it is wound in an elliptical shape.

Figure 6:
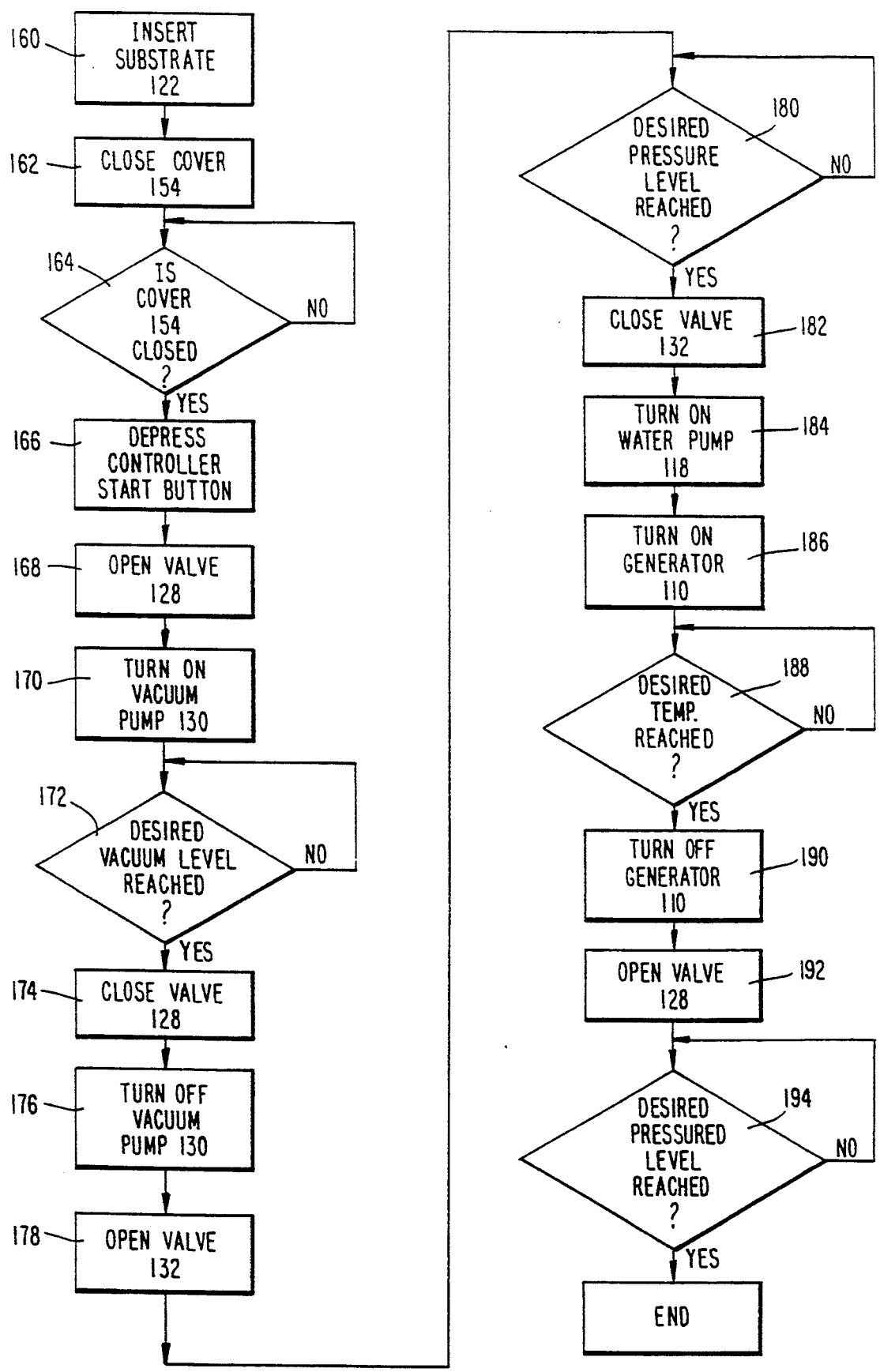
FIG. 6 is a flow chart of the operation of the curing unit.

Operation of the curing system of the present invention is best understood with reference to FIG. 6. Initially, cover 152 is opened by means of handle 156 and substrate 122 is placed on top of curing coil 116a so that traces 138 fall within the perimeter of the coil turns (step 160). Alternatively, the substrate may be positioned so that it rests on a dielectric platform with the coil above or below it.

After substrate 122 has been positioned, cover 152 is closed, thereby activating the latching interlock (steps 162 and 164). Controller 140 is then activated by depressing a "start" button, not shown (step 166). This opens valve 128 and initiates operation of vacuum pump 130 (steps 168 and 170). Pump 130 draws out the gas inside curing chamber 120 until a specified vacuum level is reached, as determined by pressure gauge 134 (step 172). In the example below the curing chamber is evacuated to 5 microns Hg. When this vacuum level is reached controller 140 closes valve 128 and shuts off vacuum pump 130 (steps 174 and 176).

Controller 140 next opens valve 132, which allows pressurized gas from tank 131 to flow into chamber 120 (step 178). When the gas pressure reaches a predetermined level, again as measured by pressure gauge 134, controller 140 closes valve 132 (steps 180 and 182). In the example described below, standard welding grade nitrogen was used to fill chamber 120 to a pressure of 10 psi.

After chamber 120 has been pressurized, controller 140 activates water pump 118 to cool coil 116 and then activates RF generator 110 (steps 184 and 186). Generator 110 outputs a high frequency, high energy radio wave signal that is fed through impedance matching network 114 to coil 116. In the example below the signal output by RF generator 110 is 1.5 kw at 13.56 MHz. Coil 116 generates electromagnetic flux that passes through the metal particles in traces 138, causing eddy currents to be generated in these particles. Preferably, this flux is of relatively uniform density across traces 138. The eddy currents heat the particles rapidly until they melt, forming solid conductors, as described in greater detail below. The temperature of the particles is sensed by optical temperature sensor 136. When the particles reach a specified temperature, controller 140 shuts off generator 110, completing the curing process (steps 188 and 190). Controller 140 then opens valve 128 and runs vacuum pump 130 until chamber 120 has been brought back to atmospheric pressure (steps 192 and 194). Typically, the metal particles melt in between 2–10 seconds, depending on the power supplied by generator 110.

The curing system of the present invention is suitable for use with a variety of metal particles and substrates. For example, higher conductivity particles such as copper, silver or copper/silver alloy may be used or lower conductivity particles such as tin/copper alloy. The substrates must be capable of withstanding the temperatures at which the selected particles melt for the short period of time during which curing occurs. For example, ceramic substrates such as mullite or alumina may be used with copper particles, which melt at 1083° C., or an alloy of 50% copper and 50% silver, which begins to melt at approximately 780° C. As another example, a substrate coated with a thermoplastic material such as a polyamide like Kapton ® or polybenzimidazole may be used with an alloy of 60% tin and 40% copper, which begins to melt at 415° C.

Traces 138 may be applied to the substrate, either as a metallic powder or viscous ink or paste containing the metallic particles in any conventional manner, or by one of the methods disclosed in copending application Ser. No. 07/852,049, entitled "Apparatus and Process for Screen Printing," filed Mar. 16, 1992, copending application Ser. No. 07/853,552, entitled "Apparatus and Method for Depositing Metal Particles on a Dielectric Substrate" or application Ser. No. 07/853,192, entitled "Method and Apparatus for Applying Particles to a Substrate in a Predetermined Pattern," all three of which are assigned to PrinTron, Inc., and incorporated by reference herein.

Because the metal particles are heated to a sufficient temperature to melt at least some of them, however, the traces must comprise a satisfactory distribution of particle sizes so as to retain their shape and size during the curing process. One acceptable composition is set forth in the example below, while other acceptable particle distributions are described hereinafter.

In general, the composition should contain a substantial percentage of large particles and a substantial percentage of small particles, thereby resulting in a bimodal particle size distribution. In one example the larger particles ranged in size between 44–74 microns and comprised approximately 45% by weight of the metal particles, while the smaller particles ranged in size between 1–5 microns and comprised approximately 45% by weight of the metal particles, with the remaining particles having sizes in between the larger and smaller particles. It should be understood that if the particle size distribution is not sufficiently wide, groups of particles will "ball up" into small spheres as the particles reach their melting temperature because the surface tension of the liquid metal overcomes other forces. Further, greater flux density or higher frequencies are needed to melt smaller particles, so that the particle size distribution selected determines the minimum frequency and power at which the particles will melt.

Other particle size range distributions are possible. For example, the distribution may have the following particle sizes in the indicated ranges of percentages by volume and screen size ranges: approximately 35–45% by volume of particles having a screen mesh size range of 230–270 mesh; approximately 35–45% by volume of particles having a size of 270–325 mesh; and approximately 10–30% by volume of particles having a size of about 325–400 mesh.

When using electromagnetic heating, the amount of energy absorbed by the particle is dependent upon the ratio of particle dimensions to the period of oscillation of the electromagnetic fields. Also, there is a maximum size of particle which can be used and still maintain good edge resolution of the printed pattern. For a conductor line width of 300 microns, the maximum size particle is conventionally 30 microns or one tenth the line width. So, for a given frequency of electromagnetic field and a given maximum particle size, the distribution of particle sizes affects the ability of the metal particles to absorb energy. It also affects the shielding effect of neighboring particles on each other by field attenuation.

In practice, particles which are larger heat up faster, especially on the surface where the current density is higher. It is theorized that these particles begin to melt away on their surface first and this flow of metal mass in liquid form wets the finer particles as it flows throughout the printed volume, which may be analogized to a solute rich melt. In effect, therefore, the finer particles act as a mortar in holding together the printed mass and preventing excess flow and distortion. As a result, this mass remains in the predetermined pattern deposited on the substrate with minimal shrinkage and no "bailing up".

Distortion is minimized by having a wide enough range of particle sizes so that the total volume of metal approaches 65–98% of the total volume taken up by the metal and voids between particles in a dry state. This advantageously reduces shrinkage.

Figure 8A:
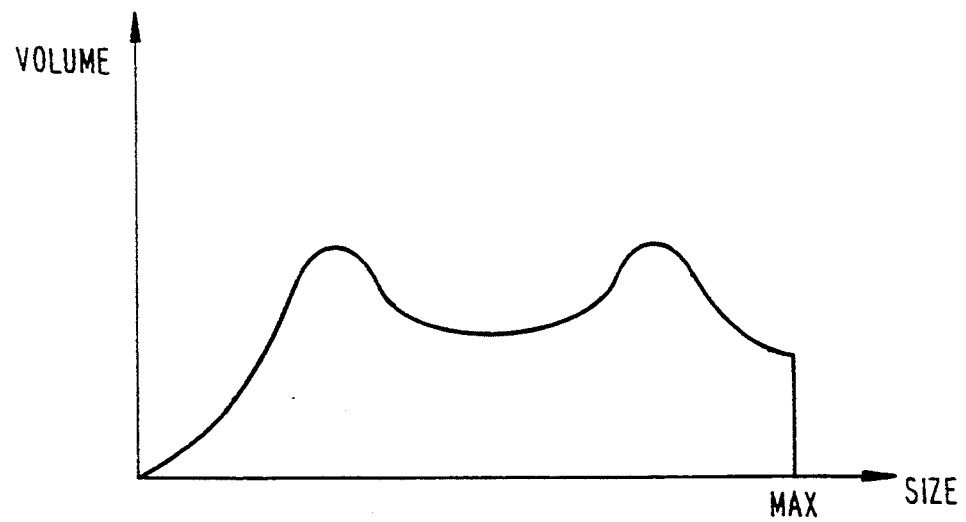
FIG. 8($a$) is a graph of a bi-modal gaussian/truncated gaussian size distribution for metal particles used in the present invention.
Figure 8B:
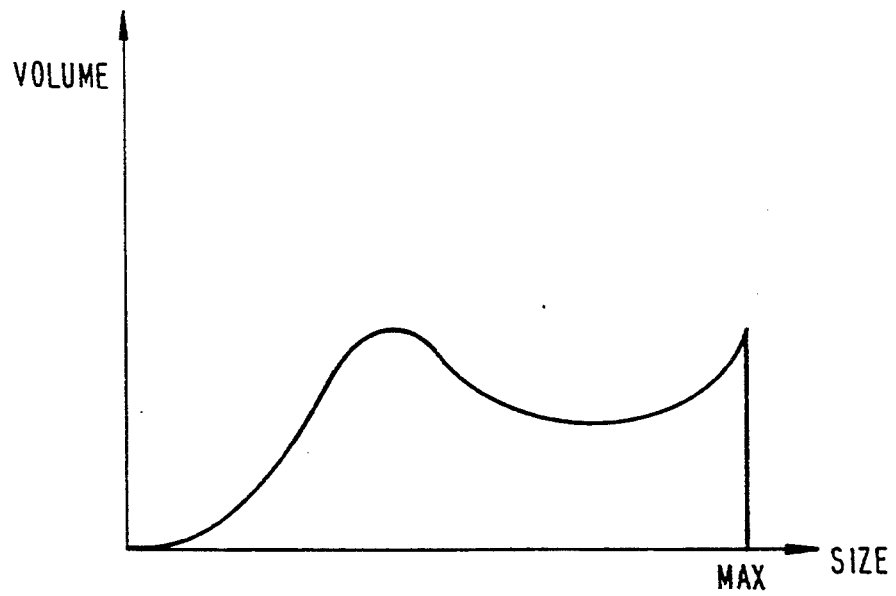

It is believed that suitable distributions are, by volume: (a) bimodal gaussian/truncated gaussian, as depicted in FIGS. 8(a); (b) bimodal gaussian/exponential, as depicted in FIGS. 8(b); and (c) bimodal with a peak or plateau in the large particle size range (which is dependent upon the frequency of the applied electromagnetic field) and another peak or plateau in the 1–5 micron range.

As will now occur to one of ordinary skill in the art, the maximum particle size will be dependent on the desired line width as aforesaid.

The fine to coarse particles may be blended together in conventional ways known in the art, such as with a roller mill.

By providing metal powder mixtures or compositions having the aforementioned types of particle size distributions, continuous electrical conductors are formed by applying electromagnetic energy thereto, as described herein, which are continuous and have minimal distortion relative to the deposited traces. The resulting microstructure of the printed and cured powder or ink will be such that the gaps and voids between the solid particles which have not melted will be filled in by the melt from the surface of the larger particles. There are substantially no voids or air gaps within the solid body of the conductor but there are also within the structure solid chunks of smaller particles which do not melt but without surrounding voids.

In one preferred embodiment of this invention, pure copper particles (or other pure single element metal particles) of different size ranges are mixed together to obtain the desired particle size distribution. Particles of different types of "pure metals" may also be mixed with each other to obtain compositions having the aforementioned types of particle size distributions. "Pure metals", as used herein are either a single element metal, or an alloy of two or more metals. Metal particles which have been coated with a second metal (e.g., of lower melting temperature) or coated with a dielectric material so that the particles can hold a charge and be electrostatically printed may also be used.

The curing time and power required to melt the metallic particles may be reduced if the particles are deoxidized. Any suitable deoxidation method may be used for this purpose, such as disclosed in copending application Ser. No. 07/853,389, entitled "Reduction of Oxides from Metal Powders" and assigned to PrinTron, Inc., which application is incorporated by reference herein.

An essential requirement of the curing process is that the cured conductors adhere sufficiently to substrate 122 to resist subsequent peeling. Satisfactory adherence to a ceramic substrate is achieved by glazing the surface thereof or by applying powdered glass to the substrate before the traces are applied. If the substrate has a thermoplastic layer, the portions of the thermoplastic underlying the traces will soften during the curing process and the metal will embed itself in the softened material, thereby resulting in satisfactory adhesion.

Figure 7:
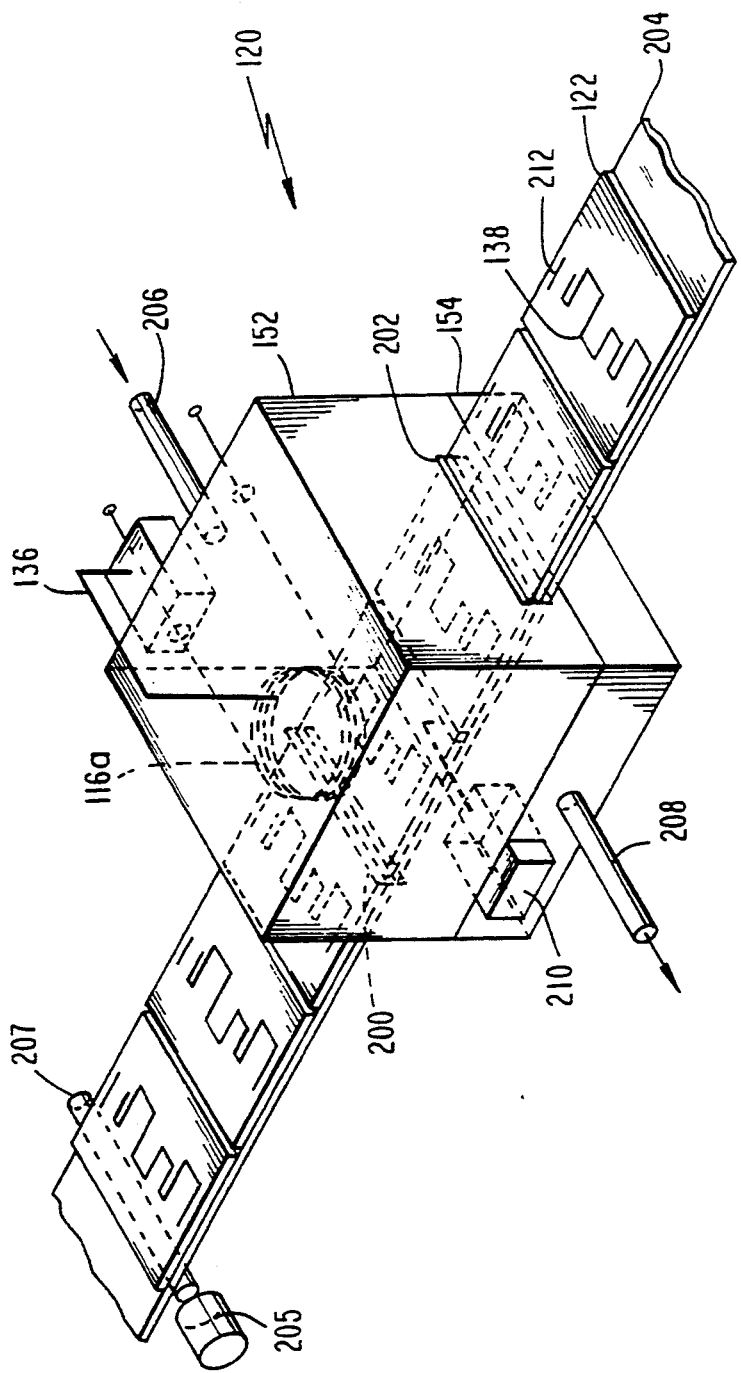
FIG. 7 is an alternative embodiment of the curing unit suitable for sequentially curing metal particles into continuous conductors on a plurality of substrates.

Referring to FIG. 7, an alternative embodiment of curing unit 120 suitable for sequential curing is shown. In this embodiment the sidewalls of cover 152 have an input port 200 and an output port 202 through which a conventional conveyor belt 204 transports substrates 122. Conveyor 204 is advanced by a conventional variable speed motor 205 which drives rollers 207. Motor 205 is operated by controller 140, as described hereinafter. Conveyor belt 204 is made of a nonconductive material, such as synthetic rubber, so as not to be affected by the strong electromagnetic field generated by coil 116a. Since curing unit 120 cannot be hermetically sealed in this embodiment, it is not evacuated. Instead, pressurized nitrogen gas or inert gas is continuously fed into curing chamber 120 through inlet pipe 206 and exhausted through outlet pipe 208. Inlet pipe 206 is positioned at the top of chamber 120 and outlet pipe 208 is positioned at the bottom so that nitrogen gas flows downwardly over the surface of substrate 122, blanketing traces 138 in nitrogen or inert gas, thereby minimizing oxidation. In this embodiment coil 116a is mounted above substrates 122, which are spaced along the length of conveyor belt 204. A conventional position detector 210, mounted on the front of cover 152, such as an optic detector, generates an output signal whenever a substrate is positioned underneath coil 116a. The output of sensor 210 is fed to the input of controller 140 and operates as described below.

The curing unit of FIG. 7 may be operated in either a "continuous mode" or "indexed mode." If used in the continuous mode each substrate 122 has deposited thereon a test trace 212 aligned along the axis of movement of conveyor belt 204. Substrates 122 are positioned on conveyor belt 204 so that test trace 212 passes under optical sensor 136 and substrate 122 moves through the curing unit. Controller 140 controls the speed of motor 205, and thus the speed at which conveyor belt 204 passes through the curing unit, in response to the output of optical sensor 136. This ensures that as traces move continuously under coil 116a they are heated to the proper curing temperature. Coil 116a either may be energized continuously during the continuous mode of operation or may be energized only when a substrate is positioned beneath it. In the later event controller 140 turns RF generator 110 on or off, depending upon the location of substrate 122 as determined by position sensor 210.

In the indexed mode conveyor belt 204 advances until a substrate is positioned under coil 116a and then stops. Such positioning is determined by controller 140 in response to the output of position sensor 210. After the substrate has been properly positioned, RF generator 110 is turned on, energizing coil 116a and curing traces 138 on the substrate into continuous conductors. Conveyor 204 is then advanced to the next substrate, where the process is repeated.

EXAMPLE

The starting material in this example was a paste, Product No. CL81-5257 manufactured by Heraeus, Inc. The paste comprises smaller copper particles, most of which range in size between 1–5 microns, and a binder and other agents which promote adhesion, such as glass frit and oxides, comprising approximately 5% by weight of the paste. To this paste was added a powdered alloy of larger particles comprising 50% copper and 50% silver, by volume, with these larger particles ranging in size between 44–74 microns. This alloy was deoxidized prior to being mixed, using the method disclosed in copending application Ser. No. 07/853,389, entitled "Reduction of Oxides From Metal Powders" assigned to PrinTron, Inc., which application is incorporated by reference herein. The larger particles comprised approximately 45% by weight of the resulting paste and the smaller particles comprised approximately 45% by weight of the resulting paste with the remaining weight percentage of the paste comprising binder and particles of intermediate size.

Traces of this composition of a thickness of approximately 10 mils and width of approximately 60 mils were applied to a dielectric substrate made of mullite. The substrate was then placed inside a solenoidal coil mounted in a polypropylene curing chamber. The coil was made of hollow copper tubing having an outside diameter of $\frac{1}{8}$ inch and 15 turns. The coil was approximately 4 inches long and had an outside diameter of approximately 1.3 inches, thereby defining a cylindrical central cavity of approximately 1 inch.

After the curing chamber was closed it was evacuated to a pressure of 5 microns Hg and then backfilled through a 3 inch evacuation pipe to a pressure of 10 psi with standard welding grade nitrogen. A sinusoidal signal from a radio frequency generator of 1.7 kw and 13.56 MHz was applied over a 50 ohm line through an impedance matching network to the solenoidal coil for a period of approximately 30 seconds. The power was increased to 2.8 kw for 15 seconds and then cut off. The solenoidal coil was cooled with water during this energization period. The resultant electromagnetic energy transmitted by the coil melted at least some of the metal particles, thereby forming continuous, homogeneous metal conductors which adhered to the substrate in the same shape as the deposited traces without appreciable shrinkage.

It will be seen readily by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definitions contained in the appended claims and equivalents thereof.

I claim:

1. A method of curing metal particles deposited in a pattern on a non-metallic substrate into continuous metal conductors arranged in said pattern, comprising applying sufficient electromagnetic energy simultaneously to said particles to melt at least some of said particles, sensing the temperature of said particles when said electromagnetic energy is being applied, and stopping application of said electromagnetic energy when said temperature reaches a specified level.

2. The method of claim 1, wherein said electromagnetic energy is applied at a radio frequency.

3. The method of claim 1, wherein said substrate is dielectric.

4. The method of claim 1, further comprising placing said substrate in a sealable chamber and substantially evacuating said chamber prior to applying said electromagnetic energy.

5. The method of claim 4, further comprising injecting a specified gas into said chamber after said chamber has been evacuated, thereby facilitating said curing.

6. The method of claim 5, wherein said gas is nitrogen.

7. The method of claim 5, wherein said gas is an inert gas.

8. A method of making a printed circuit board on a dielectric substrate on which metal particles have been deposited in a pattern, comprising applying sufficient electromagnetic energy simultaneously to said articles to melt at least some of said particles, sensing the temperature of said particles when said electromagnetic energy is being applied, and stopping application of said electromagnetic energy when said temperature reaches a specified level.

9. The method of claim 8, wherein said electromagnetic energy is applied at a radio frequency.

10. The method of claim 8, wherein said substrate is dielectric.

11. The method of claim 8, wherein said substrate is laced in a chamber having gasses therein and substantially all of said gasses are evacuated prior to applying said electromagnetic energy.

12. The method of claim 11, further comprising injecting a specified gas into said chamber after said chamber has been evacuated and before said electromagnetic energy is applied which facilitates said melting.

13. The method of claim 12, wherein said gas is nitrogen.

14. The method of claim 12, wherein said gas is an inert gas.

15. A method of curing metal particles deposited in at least one pattern on a plurality of non-metallic substrates into continuous metal conductors on said substrates comprising:
sequentially positioning said substrates proximate to a source of electromagnetic energy;
applying sufficient electromagnetic energy simultaneously to substantially all of said particles on each of said substrates positioned proximate to said source to melt at least some of said particles;
sensing the temperature of said particles when said electromagnetic energy is being applied; and
stopping application of said electromagnetic energy when said temperature reaches a specified level.

16. The method of claim 15, wherein said electromagnetic energy is applied at a radio frequency.

17. The method of claim 15, wherein said substrate is dielectric.

18. The method of claim 17, further comprising sequentially positioning said substrates in a chamber prior to applying said electromagnetic energy.

19. The method of claim 18, further comprising flowing a specified gas through said chamber.

20. The method of claim 19, wherein said gas is nitrogen.

21. The method of claim 18, wherein said gas is an inert gas.

22. A method of making printed circuits on a plurality of dielectric substrates on which metal particles have been deposited in at least one pattern, comprising:
sequentially positioning said substrate proximate to a source of electromagnetic energy;
applying sufficient electromagnetic energy simultaneously to substantially all of said particles on each of said substrates positioned proximate thereto to melt at least some of said particles;
sensing the temperature of said particles when said electromagnetic energy is being applied; and
stopping application of said electromagnetic energy when said temperature reaches a specified level.

23. The method of claim 22, wherein said electromagnetic energy is applied at a radio frequency.

24. The method of claim 22, further comprising:
sequentially positioning said one of said substrates in a chamber; and
flowing a specified gas through said chamber.

25. The method of claim 24, wherein said gas is nitrogen.

26. The method of claim 24, wherein said gas is an inert gas.

27. A method of curing metal particles deposited in a pattern on a non-metallic substrate into continuous metal conductors arranged in said pattern, comprising:
applying sufficient electromagnetic energy to said particles to melt at least some of said particles;
sensing the temperature of said particles when said electromagnetic energy is being applied; and
stopping application of said electromagnetic energy when said temperature reaches a specified level.

28. A method of making a printed circuit board on a dielectric substrate on which metal particles have been deposited in a pattern, comprising:
applying sufficient electromagnetic energy to said particles to melt at least some of said particles;
sensing the temperature of said particles when said electromagnetic energy is being applied; and
stopping application of said electromagnetic energy when said temperature reaches a specified level.

29. A method of curing metal particles deposited in at least one pattern on a plurality of non-metallic substrates into continuous metal conductors on said substrates comprising:
sequentially positioning said substrates proximate to a source of electromagnetic energy;

applying sufficient electromagnetic energy to said particles on each of said substrates to melt at least some of said particles;

sensing the temperature of said particles on each of said substrates when said electromagnetic energy is being applied; and stopping application of said electromagnetic energy when said temperature reaches a specified level.

30. A method of making printed circuits on a plurality of dielectric substrates on which metal particles have been deposited in at least one pattern, comprising:

sequentially positioning said substrate proximate to a source of electromagnetic energy;

applying sufficient electromagnetic energy to said particles on each of said substrates positioned proximate thereto to melt at least some of said particles;

sensing the temperature of said particles on each of said substrates when said electromagnetic energy is applied; and stopping application of said electromagnetic energy when said temperature reaches a specified level.

* * * * *